(12) United States Patent
Chao et al.

(10) Patent No.: US 12,144,231 B2
(45) Date of Patent: Nov. 12, 2024

(54) DISPLAY SUBSTRATES, DISPLAY PANELS, AND DISPLAY DEVICES

(71) Applicant: HEFEI VISIONOX TECHNOLOGY CO., LTD., Anhui (CN)

(72) Inventors: Wei Chao, Kunshan (CN); Peng Liao, Kunshan (CN); Zhonglai Wang, Kunshan (CN); Xiaojia Liu, Kunshan (CN); Jingli Chen, Kunshan (CN); Buwei Pan, Kunshan (CN); Huayun Hou, Kunshan (CN)

(73) Assignee: HEFEI VISIONOX TECHNOLOGY CO., LTD., Hefei (CN)

( * ) Notice: Subject to any disclaimer, the term of this patent is extended or adjusted under 35 U.S.C. 154(b) by 540 days.

(21) Appl. No.: 17/473,381

(22) Filed: Sep. 13, 2021

(65) Prior Publication Data

US 2021/0408174 A1 Dec. 30, 2021

Related U.S. Application Data

(63) Continuation of application No. PCT/CN2020/084969, filed on Apr. 15, 2020.

(30) Foreign Application Priority Data

Aug. 29, 2019 (CN) .......................... 201910808756.1

(51) Int. Cl.
*H10K 59/65* (2023.01)
*H10K 59/131* (2023.01)
(Continued)

(52) U.S. Cl.
CPC .......... *H10K 59/65* (2023.02); *H10K 59/131* (2023.02); *H10K 71/00* (2023.02); *H10K 77/111* (2023.02);
(Continued)

(58) Field of Classification Search
CPC ...... H10K 59/65; H10K 59/131; H10K 71/00; H10K 77/111; H10K 2102/103;
(Continued)

(56) References Cited

U.S. PATENT DOCUMENTS

2013/0258234 A1  10/2013  Park et al.
2016/0133424 A1*  5/2016  Chou ................. H01J 1/3042
                                               257/11

(Continued)

FOREIGN PATENT DOCUMENTS

CN     107946341 A     4/2018
CN     108389879 A     8/2018
(Continued)

OTHER PUBLICATIONS

Chinese Decision of Rejection 100191(CN Application No. 201910808756.1) with brief English translation, dated Mar. 3, 2022, 8 pages.

(Continued)

*Primary Examiner* — Karen Kusumakar
*Assistant Examiner* — Shawn Shaw Muslim
(74) *Attorney, Agent, or Firm* — Quarles & Brady LLP

(57) ABSTRACT

The present application provides a display substrate, a display panel, and a display device. The display substrate includes a substrate layer. The substrate layer includes a first substrate portion and a second substrate portion joined to each other. The first substrate portion is made of a first substrate material and configured to be disposed opposite to a photosensitive element. The second substrate portion is made of a second substrate material. A light transmittance of the first substrate material is larger than or equal to a light transmittance threshold, and a light transmittance of the second substrate material is smaller than the light transmittance threshold.

18 Claims, 10 Drawing Sheets

(51) Int. Cl.
*H10K 71/00* (2023.01)
*H10K 77/10* (2023.01)
*H10K 102/00* (2023.01)
*H10K 102/10* (2023.01)

(52) U.S. Cl.
CPC .. *H10K 2102/103* (2023.02); *H10K 2102/311* (2023.02)

(58) Field of Classification Search
CPC .. H10K 2102/311; H10K 59/12; H10K 59/60; H04M 1/0264; H04M 1/0266; Y02E 10/549; G09F 9/301
See application file for complete search history.

(56) References Cited

U.S. PATENT DOCUMENTS

| 2019/0221782 A1* | 7/2019 | Sun | H10K 77/111 |
| 2020/0077200 A1* | 3/2020 | Lim | H04R 1/028 |
| 2021/0098722 A1 | 4/2021 | Ma | |

FOREIGN PATENT DOCUMENTS

| CN | 108428729 A | 8/2018 |
| CN | 108732841 A | 11/2018 |
| CN | 208384465 A | 1/2019 |
| CN | 109494241 A | 3/2019 |
| CN | 109697396 A | 4/2019 |
| CN | 109801562 A | 5/2019 |
| CN | 109801903 A | 5/2019 |
| CN | 09994047 A | 7/2019 |
| CN | 110034152 A | 7/2019 |
| CN | 110047846 A | 7/2019 |
| CN | 110061038 A | 7/2019 |
| CN | 110085766 A | 8/2019 |
| CN | 110166607 A | 8/2019 |
| CN | 110544433 A | 12/2019 |
| TW | 201339700 A | 10/2013 |

OTHER PUBLICATIONS

Huang Yu et. al., Development of laser lift-off technology used in the field of flexible electronics, Laser Technology, Jul. 2018, p. 440-445, vol. 42, No. 4, China.

Yang Tiejun et. al., Industrial Patent Analysis Report vol. 32 New Display Jun. 2015, p. 366-p. 378, China.

International Search Report and Written Opinion (International Application No. PCT/CN2020/084969) with English Translation, dated Jul. 17, 2020, 14 pages.

Chinese First Office Action 100191 (CN Application No. 201910808756.1) and Search Result with English Translation, dated Dec. 31, 2020, 19 pages.

Chinese Second Office Action 100191 (CN Application No. 201910808756.1) and Search Result with English Translation, dated Jul. 6, 2021, 8 pages.

Taiwan First Office Action (TW Application No. 109114099 and Search Result with English Translation, dated Dec. 31, 2020, 9 pages.

Taiwan Second Office Action (TW Application No. 109114099 and Search Result with English Translation, dated Apr. 30, 2021, 5 pages.

* cited by examiner

DISPLAY SUBSTRATES, DISPLAY PANELS, AND DISPLAY DEVICES

CROSS-REFERENCE TO RELATED APPLICATIONS

This application is a continuation under 35 U.S.C. § 120 of international patent application PCT/CN2020/084969 filed on Apr. 15, 2020, which claims priority to Chinese Patent Application No. 201910808756.1, entitled "DISPLAY SUBSTRATES, DISPLAY PANELS, AND DISPLAY DEVICES", filed on Aug. 29, 2019, the contents of both applications are hereby incorporated by reference.

TECHNICAL FIELD

The present application relates to the field of display technology.

BACKGROUND

In recent years, the full-screen technology has become popular. The full screen makes the display device look more advanced. The relatively large screen can be set on the front surface of a device of a normal size, which significantly improves the visual experience. Therefore, much attention is being paid to the full-screen display device by many manufacturers.

Additionally, a photosensitive element, such as a camera, is often disposed in a full-screen display device such as a mobile phone. Sufficient lights need to enter the photosensitive element in order to ensure the normal functioning of the photosensitive element.

SUMMARY

In view of this, there is a need to provide a display substrate, a display panel, and a display device.

A display substrate includes a substrate layer. The substrate layer includes a first substrate portion and a second substrate portion joined to the first substrate portion. The first substrate portion is made of a first substrate material. The second substrate portion is made of a second substrate material. A light transmittance of the first substrate material is larger than or equal to a light transmittance threshold, and a light transmittance of the second substrate material is smaller than the light transmittance threshold. In an embodiment, the first substrate portion is configured to be disposed opposite to a photosensitive element.

A display panel includes a substrate layer and light-emitting members. The substrate layer includes a first substrate portion and a second substrate portion joined to the first substrate portion. The first substrate portion is made of a first substrate material. The second substrate portion is made of a second substrate material. A light transmittance of the first substrate material is larger than or equal to a light transmittance threshold, and a light transmittance of the second substrate material is smaller than the light transmittance threshold. The light-emitting members are disposed at a side of the substrate layer. The layer of the light-emitting members includes a first pixel region and a second pixel region. The first pixel region is disposed at a side of the first substrate portion. The second pixel region is disposed at a side of the second substrate portion. In an embodiment, the first substrate portion is configured to be disposed opposite to a photosensitive element, and the light-emitting members are disposed at the side of the substrate layer away from the photosensitive element. In particular, the first pixel region is disposed at the side of the first substrate portion away from the photosensitive element, and the second pixel region is disposed at the side of the second substrate portion away from the photosensitive element.

A display device includes the above-described display panel and a photosensitive element. The photosensitive element is opposite to the first substrate portion and is disposed at a side of the first substrate portion away from the first pixel region of the light-emitting members.

In the display panel based on the display substrate of the present application, the region corresponding to the first substrate portion can normally display images while allowing sufficient lights to transmit therethrough, so that the photosensitive element can collect the lights transmitted through the first substrate portion for normal operation.

BRIEF DESCRIPTION OF THE DRAWINGS

The drawings used in the description of the embodiments are described briefly as follows in order to more clearly illustrate the embodiments of the present application. It is apparent that the drawings in the following description are only for some embodiments of the present application. Other drawings can be derived by one ordinary skill in the art according to these drawings without any creative work.

DETAILED DESCRIPTION

For a clear understanding of the objectives, technical solutions, and advantages of the present application, the present application will now be described in detail with reference to the accompanying drawings and embodiments. It should be understood that the following description is merely for explaining the embodiments of the present application, and does not intend to limit the scope of the present application.

The display device includes a display panel which is commonly based on a display substrate. The display substrate used to manufacture a flexible display panel generally includes a support base and a flexible substrate layer formed on the support base. The support base is peeled off after the display panel being formed. How to make the display substrate suitable for the requirements of the full screen is a problem to be promptly addressed at present.

Figure 1:
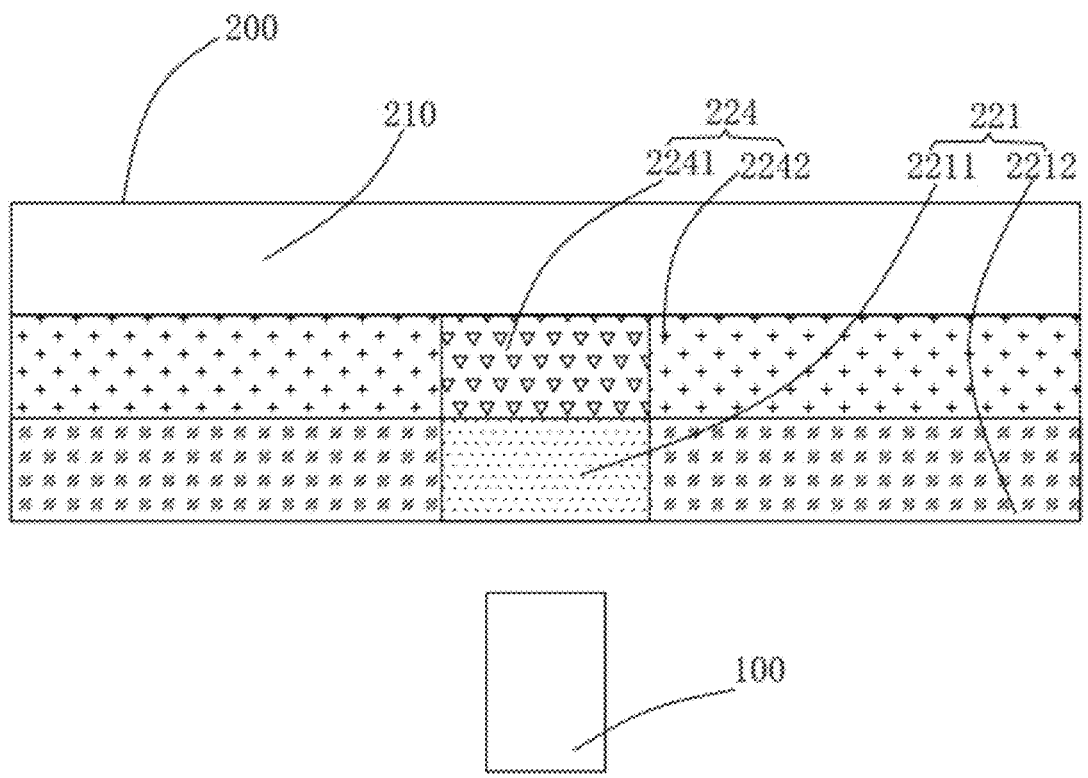
FIG. 1 is a schematic view of a display device according to an embodiment of the present application.

Referring to FIG. 1, the present application provides a display device 10 which includes a photosensitive element 100 and a display panel 200. The display device 10 can be a mobile phone or the like. The photosensitive element 100 can be a camera, a fingerprint sensor, or the like.

The display panel 200 includes light-emitting members 210 and a substrate layer 221.

The substrate layer 221 includes a first substrate portion 2211 and a second substrate portion 2212 joined to each other. The light-emitting members 210 are disposed on the substrate layer 221. The layer of the light-emitting members 210 can include a first pixel region and a second pixel region. The first pixel region is disposed on the first substrate portion 2211, and the second pixel region is disposed on the second substrate portion 2212. Both regions of the display panel corresponding to the first substrate portion 2211 and the second substrate portion 2212 can normally display images.

Specifically, the light-emitting members 210 can be an organic light-emitting element which can each include an anode, a hole injection layer, a hole transport layer, an organic light-emitting layer, an electron transport layer, and/or an electron injection layer, etc. It should be understood that the light-emitting members 210 is not limited and can be an inorganic light-emitting element.

The first substrate portion 2211 is disposed opposite to the photosensitive element 100. The first substrate portion 2211 is made of a first substrate material, and the second substrate portion 2212 is made of a second substrate material. That is, the first substrate portion 2211 and the second substrate portion 2212 comprise different materials. Herein, the "different materials" refer to materials with different components, or different component proportions, or both.

A light transmittance of the first substrate material is larger than or equal to a light transmittance threshold, and a light transmittance of the second substrate material is smaller than the light transmittance threshold. In the present application, the light transmittance threshold for a specific material refers to the light transmittance of this material with a specific thickness for the lights with a specific wavelength, and the light transmittance threshold is set by actual needs. For example, the light transmittance of a specific material being 80% may refer to that the light transmittance of this material with the thickness of 10 μm for the lights with the wavelength larger than 400 nm is 80%. That is, the light transmittances of the first and second substrate materials and the light transmittance threshold are compared under the conditions of the same material thickness and the same light wavelength.

Optionally, the substrate layer 221 has the same thickness in all regions. That is, the first substrate portion 2211 has the same thickness as the second substrate portion 2212.

The region of the display panel 200 corresponding to the first substrate portion 2211 can normally display images while allowing sufficient lights to transmit therethrough, so that the photosensitive element 100 can collect the lights transmitted through the first substrate portion 2211 for normal operation.

Figure 2:
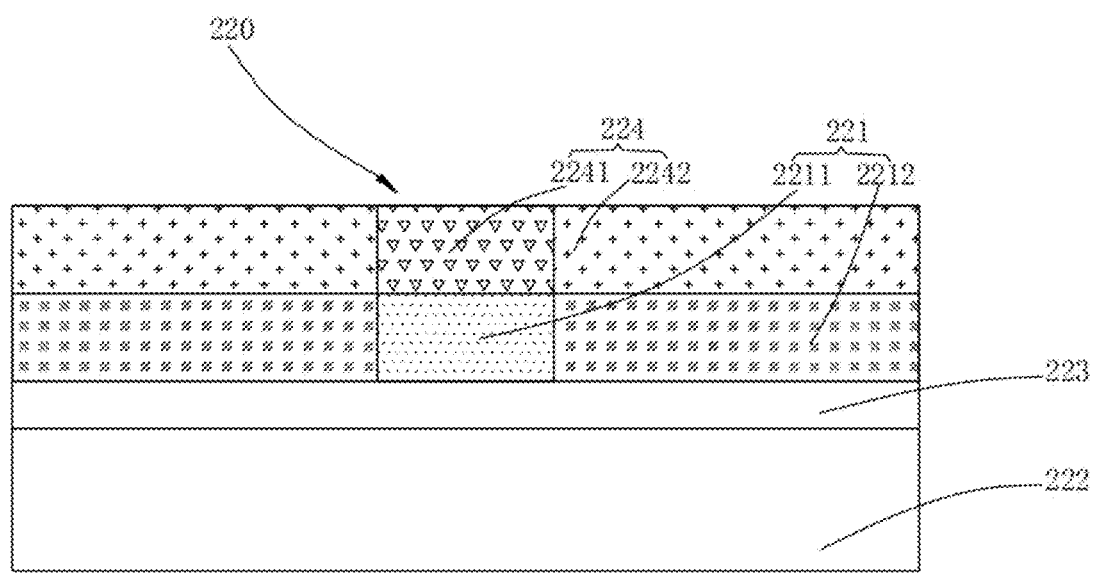
FIG. 2 is a schematic view of a display substrate according to an embodiment of the present application.

Optionally, referring to FIG. 2, a display substrate 220, which is used in processing to form the above-described display panel 200, is provided. The display substrate 220 can be an array substrate or the like.

The display substrate 220 includes the substrate layer 221. The substrate layer 221 includes the first substrate portion 2211 and the second substrate portion 2212 joined to each other. The first substrate portion 2211 is configured to be disposed opposite to the photosensitive element 100. The first substrate portion 2211 is made of the first substrate material, and the second substrate portion 2212 is made of the second substrate material. The light transmittance of the first substrate material is larger than or equal to the light transmittance threshold, and the light transmittance of the second substrate material is smaller than the light transmittance threshold.

Optionally, the first substrate material can be a transparent polyimide, i.e., a transparent PI. The second substrate material can be a yellow polyimide, i.e., a yellow PI. The transparent PI and the yellow PI have different light transmittances due to their different molecular structures.

By selecting the transparent PI as the first substrate material of the first substrate portion 2211 and selecting the yellow PI as the second substrate material of the second substrate portion 2212, it is convenient to make the light transmittance of the first substrate material larger than or equal to the light transmittance threshold and make the light transmittance of the second substrate material smaller than the light transmittance threshold. It should be understood that the first substrate material and/or the second substrate material can be other flexible or rigid materials, and the present application is not limited thereto.

The first substrate portion 2211 has a relatively large light transmittance since the light transmittance of the first substrate material (e.g., the transparent PI) is larger than or equal to the light transmittance threshold. Thus, in the display panel 200 formed from the display substrate 220 in the present application, the region corresponding to the first substrate portion 2211 can normally display images while allowing sufficient lights to transmit therethrough, so that the photosensitive element 100 can collect the lights transmitted through the first substrate portion 2211 for normal operation. That is, the display substrate 220 of the present application can well satisfy the requirements of the full-screen display.

Optionally, the light transmittance of the second substrate material (e.g., the yellow PI) is smaller than the light transmittance threshold. The material with relatively small light transmittance usually has good thermal properties, such as a relatively small thermal expansion coefficient and a relatively high thermal decomposition temperature. For example, the yellow PI can be processed at a temperature of about 500° C. without decomposition. However, the transparent PI has to be processed at a temperature below 390° C. to avoid decomposition, as the transparent PI is very likely to decompose at a temperature larger than 390° C. Therefore, the second substrate portion 2212 made of the second substrate material has higher stability in the production, which therefore increases the production stability of the display panel 200.

The material with relatively small light transmittance also usually has good mechanical properties, such as high tensile strength and a large Young's modulus. Thus, the second substrate portion 2212 made of the second substrate material can effectively increase the reliability (for example, the bending resistance and the like) of the display panel 200.

Optionally, still referring to FIG. 2, the material of the substrate layer 221 comprises a flexible material. The display substrate 220 further includes a support base 222 and a sacrificial layer 223. The support base 222 can be a rigid base such as a glass base or the like. The sacrificial layer 223 is made of a homogeneous material and is disposed on the support base 222. The substrate layer 221 is disposed on the sacrificial layer 223.

When the material of the substrate layer 221 comprises a flexible material, the substrate layer 221 is usually formed on the support base 222 (such as the glass base) having an acceptable strength facilitating the subsequent process on the substrate layer 221. After that, various functional films or layers are deposited onto the substrate layer 221, facilitating the subsequent manufacture of the display panel 200. Finally, the support base 222 is peeled off in a Laser Lift-Off (LLO) process to complete the manufacture of the flexible display panel 200.

Optionally, the sacrificial layer 223 is firstly formed on the support base 222, and then the flexible substrate layer 221 is formed on the sacrificial layer 223. In the final LLO process, since the sacrificial layer 223 is made of the homogeneous material, the ultraviolet laser beams with the same power can be irradiated onto the sacrificial layer 223 from a back side of the support base 222 to uniformly decompose the structure of molecules in all regions of the sacrificial layer 223, so that the flexible substrate layer 221 and the support base 222 can be separated from each other uniformly.

Optionally, a thickness of the sacrificial layer 223 can be smaller than a thickness threshold. Herein, the "thickness threshold" refers to a thickness value allowing no or little materials of the sacrificial layer 223 to remain on the flexible substrate layer 221 after the flexible substrate layer 221 and the support base 222 are separated from each other, so that the flexibility of the finally formed display panel 200 and the light transmittance of the peeled off display substrate 220 will not be affected. The specific thickness threshold can be set according to needs. For example, the thickness threshold can be set as 50 nm.

The material of the sacrificial layer 223 is not limited as long as the molecular structure of the material of the sacrificial layer 223 can be decomposed when exposed to the ultraviolet laser beam, so that the flexible substrate layer 221 and the support base 222 can be separated from each other. For example, the material of the sacrificial layer 223 can be selected from materials such as amorphous silicon (a-Si) and indium tin oxide (ITO) formed by the method such as physical vapor deposition (PVD) or chemical vapor deposition (CVD). Alternatively, the sacrificial layer 223 can be a silicon-based organic film or layer formed by a method such as coating.

Optionally, the material of the substrate layer 221 may comprise a rigid material. In this embodiment, the display substrate 220 can include no support base 222 or sacrificial layer 223.

Optionally, referring to FIG. 1 or FIG. 2, the display substrate 220 further includes a drive circuit layer 224 configured to drive the light-emitting members 210 and disposed between the light-emitting members 210 and the substrate layer 221.

The drive circuit layer 224 includes a first circuit portion 2241 located right on the first substrate portion 2211 and a second circuit portion 2242 located right on the second substrate portion 2212. The first circuit portion 2241 is located at a side of the first substrate portion 2211 away from the photosensitive element 100. The second circuit portion 2242 is located at a side of the second substrate portion 2212 away from the photosensitive element 100.

A light transmittance of the first circuit portion 2241 is larger than a light transmittance of the second circuit portion 2242. Thus, more lights can be transmitted through the first circuit portion 2241, thereby facilitating the photosensitive element 100 to work as normal.

Optionally, the first circuit portion 2241 can include one or more first wiring layers. At least one first wiring layer is made of a transparent conductive material such as indium zinc oxide (IZO) and indium tin oxide (ITO), so that the first circuit portion 2241 can have relatively high light transmittance.

Optionally, the second circuit portion 2242 can include one or more second wiring layers. The material of each second wiring layer can include metal, so that the second circuit portion 2242 can have relatively low light transmittance. More specifically, any one of the second wiring layers may be a metal film or layer (e.g., aluminum (Al), titanium (Ti), molybdenum (Mo), silver (Ag)), a composite film or layer comprising multiple metal films or layers (e.g., Mo/Al/Mo, Mo/Al/Mo), a composite film or layer comprising a metal film or layer and/or a transparent conductive film or layer (e.g., Ag/ITO/Ag), etc., so that the second wiring layer of the second circuit portion 2242 can have optimal electrical conductivity.

The metal material can improve the performance such as the carrier mobility, the threshold voltage, the leakage current, and the like of the drive unit (e.g., thin-film transistors (TFT)) of the drive circuit layer 224 as compared to the transparent conductive material.

Optionally, the first circuit portion 2241 and the second circuit portion 2242 can be made of the same material, which is not limited in the present application.

Optionally, a circuit distribution density of the first circuit portion 2241 is smaller than a circuit distribution density of the second circuit portion 2242. In this embodiment, the structure of the first circuit portion 2241 is simpler than the structure of the second circuit portion 2242, and thus the light transmittance of the first circuit portion 2241 is larger than the light transmittance of the second circuit portion 2242.

More specifically, the first circuit portion 2241 can include a passive drive circuit for driving the light-emitting member 210 located thereon, and the second circuit portion 2242 can include an active drive circuit for driving the light-emitting member 210 located thereon.

Optionally, in order to make the light-emitting members 210 on both the first circuit portion 2241 and the second circuit portion 2242 to have a uniform display effect, a regulating circuit for the first circuit portion 2241 can be provided in the second circuit portion 2242 to regulate and compensate for the signals of the first circuit portion 2241. Alternatively, a regulating module can be provided in the driver chip of the display panel 220 to regulate and compensate for the signals of the first circuit portion 2241.

Optionally, when the material of the substrate layer 221 of the display substrate 220 comprises a flexible material, and the display substrate 220 includes the drive circuit layer 224, the method for manufacturing the display substrate 220 may include steps S11 to S13.

Figure 3A:
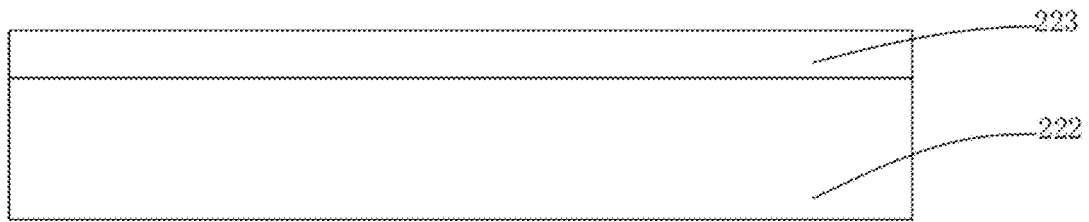
FIGS. 3A to 3C are schematic structural views showing a manufacturing process of the display substrate according to an embodiment of the present application.

Referring to FIG. 3A, in step S11, the sacrificial layer 223 is formed on the support base 222.

The sacrificial layer 223 is made of a homogeneous material and has a thickness smaller than the threshold thickness.

Figure 3B:
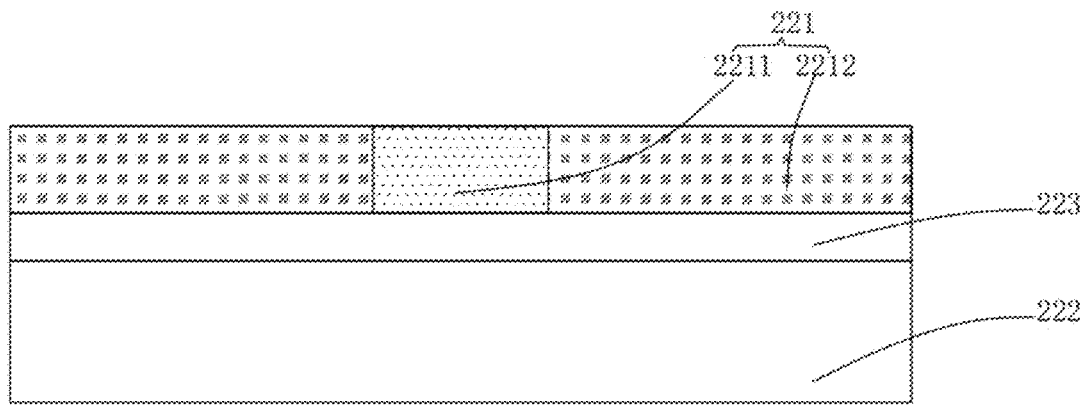

Referring to FIG. 3B, in step S12, the substrate layer 221 is formed on the sacrificial layer 223.

Firstly, the second substrate portion 2212 can be formed on the sacrificial layer 223 by the method such as coating or the like and dried in a thermal vacuum drying device (HVCD). The second substrate portion 2212 can specifically be the yellow PI. In this embodiment, a region of the sacrificial layer 223 is reserved and not coated by the second substrate portion 2212.

Then, the first substrate portion 2211 can be formed on the reserved region of the sacrificial layer 223 by the method of coating or ink-jet printing (IJP) followed by high-temperature curing. The first substrate portion 2211 can specifically be the transparent PI film or layer. The first substrate portion 2211 and the second substrate portion 2212 together form the substrate layer 221.

Figure 3C:
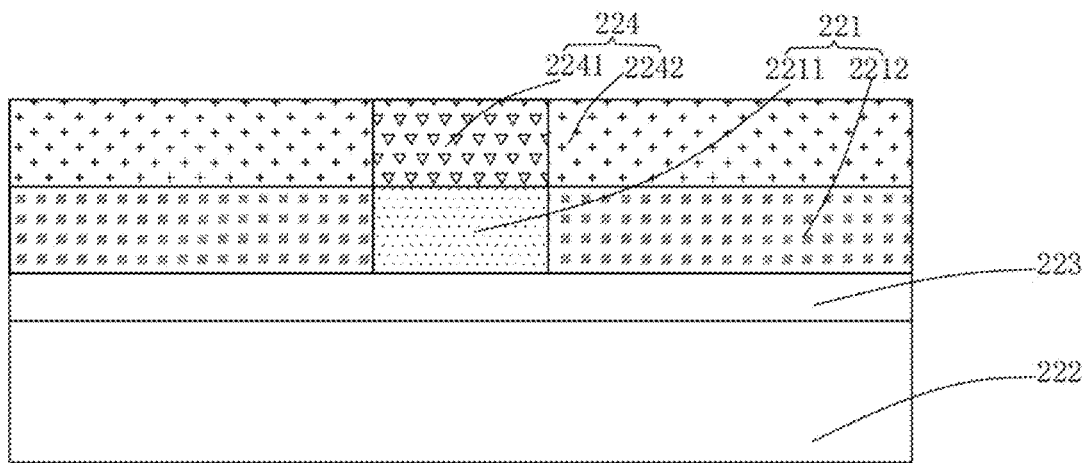

Referring to FIG. 3C, in step S13, the drive circuit layer 224 is formed on the substrate layer 221.

Firstly, the second circuit portion 2242 can be formed on the second substrate portion 2212. The second circuit portion 2242 can include a second wiring layer including one or more metal materials. Then the first circuit portion 2241 is formed on the first substrate portion 2211. The first circuit portion 2241 can include a first wiring layer made of one or more transparent materials such as IZO, ITO, etc. The first circuit portion 2241 and the second circuit portion 2242 together form the drive circuit layer 224.

Optionally, in this step, the drive circuit layer 224 on the first substrate portion 2211 and the second substrate portion 2212 can also be made of the same material and formed in one process, thereby simplifying the producing process.

Optionally, when the material of the substrate layer 221 of the display substrate 220 comprises a flexible material, and the display substrate 220 includes the drive circuit layer 224, the method for manufacturing the display substrate 220 may include steps S21 to S23.

Figure 4A:
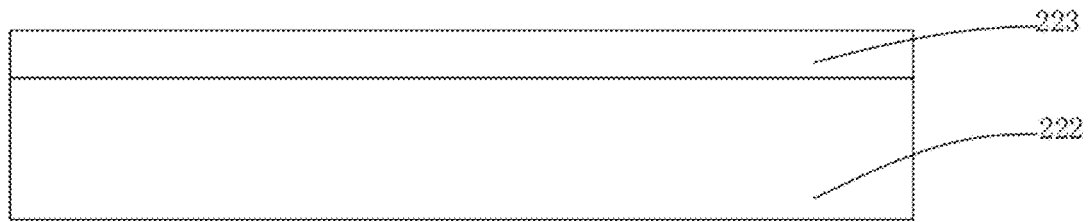
FIGS. 4A to 4C are schematic structural views showing a manufacturing process of the display substrate according to another embodiment of the present application.

Referring to FIG. 4A, in step S21, the sacrificial layer 223 is formed on the support base 222.

The sacrificial layer 223 is made of a homogeneous material and has a thickness smaller than the threshold thickness.

Figure 4B:
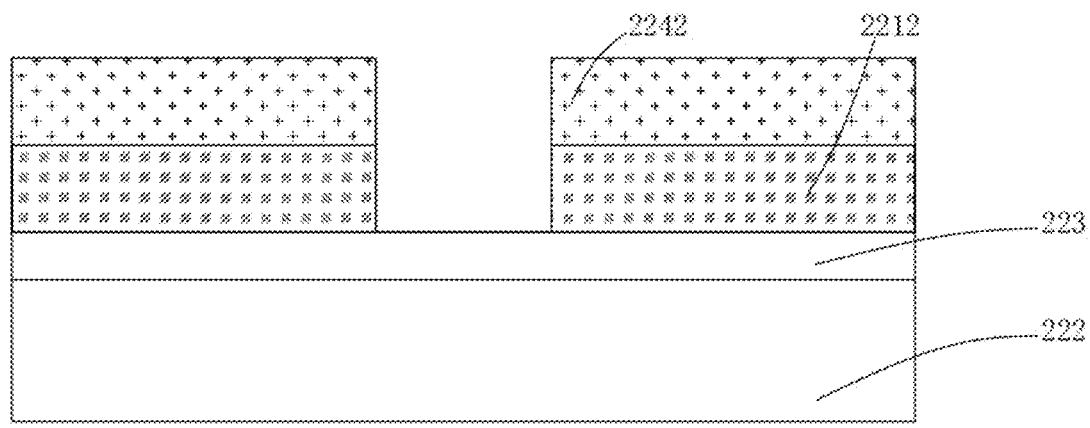

Referring to FIG. 4B, in step S22, the second substrate portion 2212 is formed on the sacrificial layer 223, and the second circuit portion 2242 is formed on the second substrate portion 2212.

Firstly, the second substrate portion 2212 can be formed on the sacrificial layer 223 by the method such as coating or the like and dried by a thermal vacuum drying device (HVCD). The second substrate portion 2212 can specifically be the yellow PI. In this embodiment, a region of the sacrificial layer 223 is reserved and not coated by the second substrate portion 2212.

Then, the second circuit portion 2242 can be formed on the second substrate portion 2212. The second circuit portion 2242 can include a second wiring layer made of one or more metal materials.

Figure 4C:
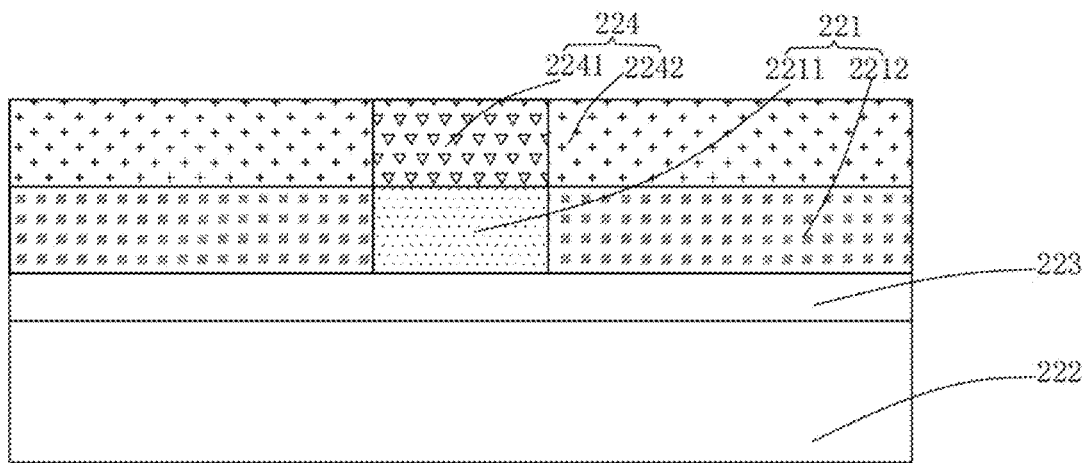

Referring to FIG. 4C, in step S23, the first substrate portion 2211 is formed on the sacrificial layer 223, and the first circuit portion 2241 is formed on the first substrate portion 2211.

Firstly, the first substrate portion 2211 can be formed on the reserved region of the sacrificial layer 223 by the method of coating or ink-jet printing (IJP) followed by high-temperature curing. The first substrate portion 2211 can specifically be the transparent PI film or layer. The first substrate portion 2211 and the second substrate portion 2212 together form the substrate layer 221.

Then the first circuit portion 2241 is formed on the first substrate portion 2211. The first circuit portion 2241 can include a first wiring layer made of one or more transparent materials such as IZO, ITO, etc. The first circuit portion 2241 and the second circuit portion 2242 together form the drive circuit layer 224.

The films or layers having similar light transmittances can be processed at similar temperatures. The first substrate portion 2211 and the first circuit portion 2241 having the relatively large light transmittances can be formed after the second substrate portion 2212 and the second circuit portion 2242 having the relatively small light transmittances are formed.

Therefore, suitable materials can be selected to allow the films or layers in the region, corresponding to the first substrate portion 2211 of the display substrate 220, to be processed at similar temperatures (e.g., 390° C. to 400° C.), and allow the films or layers in the region, corresponding to the second substrate portion 2212 of the display substrate 220, to be processed at similar temperatures (e.g., 450° C. to 500° C.), thereby facilitating the stability in controlling the process conditions.

In addition to the wiring layers, the drive circuit layer 224 can further include a semiconductor active layer. In this embodiment, in order to allow the films or layers in the region, corresponding to the first substrate portion 2211 of the display substrate 220, to be processed at similar temperatures and allow the films or layers in the region, corresponding to the second substrate portion 2212 of the display substrate 220, to be processed at similar temperatures, indium gallium zinc oxide (IGZO) can be selected as the material of the portion of the semiconductor active layer in the region corresponding to the first substrate portion 2211, and low-temperature polycrystalline silicon (LTPS) can be selected as the material of the portion of the semiconductor active layer in the region corresponding to the second substrate portion 2212.

The processing in the region corresponding to the second substrate portion 2212 at the relatively high temperature is also conducive to increasing the performance such as the carrier mobility, the threshold voltage, the leakage current, and the like of the drive unit (e.g., the thin film transistors (TFT)) of the drive circuit layer 224.

Figure 5:
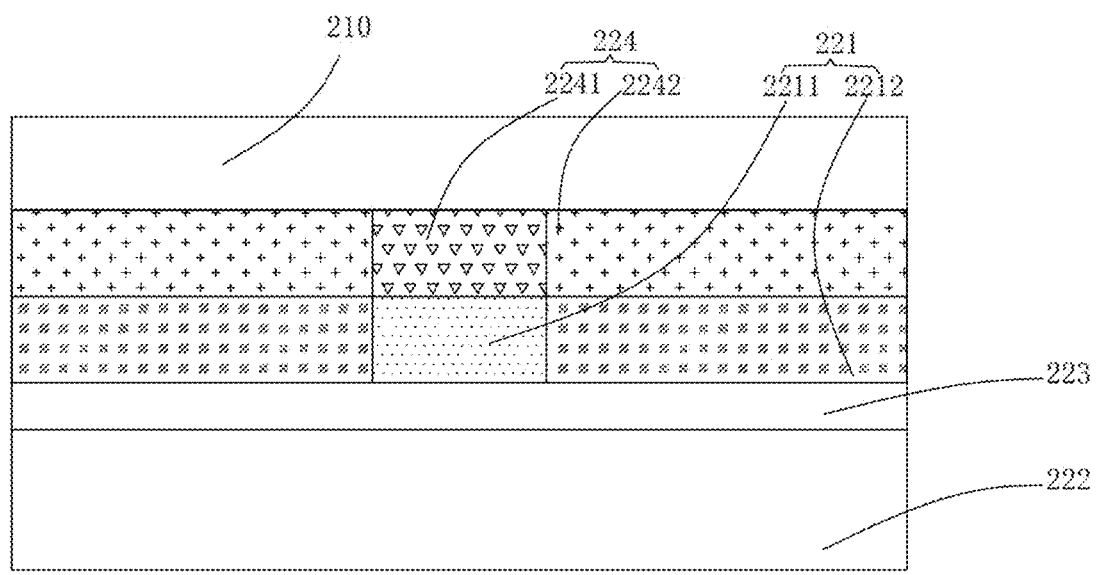
FIGS. 5 and 6 are schematic structural views showing a manufacturing process of the display panel according to an embodiment of the present application.
Figure 6:
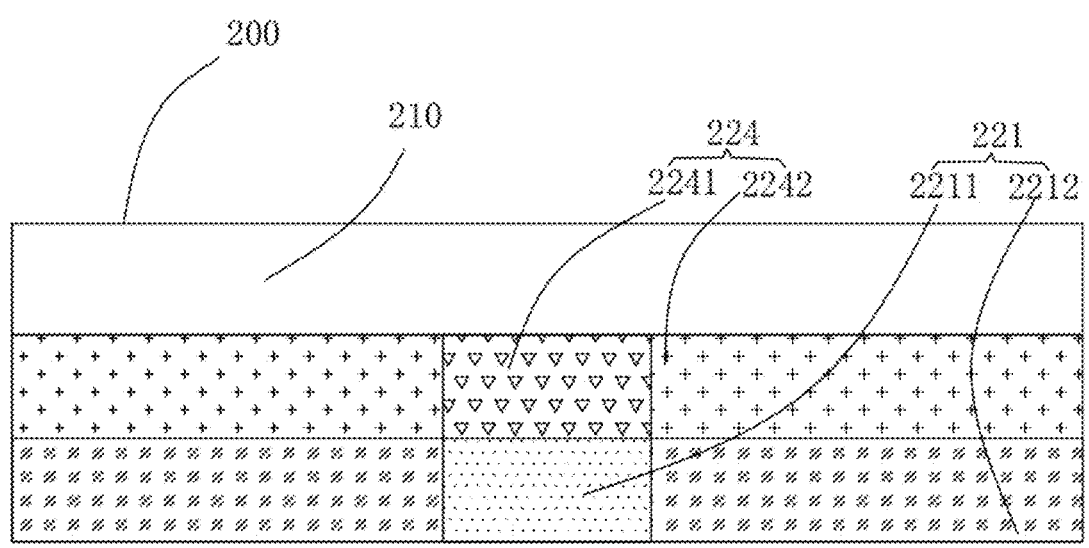

A method for forming the display panel 200 by using the display substrate 220 manufactured by the method in the above-described embodiments can include the following steps:

step S4, forming the light-emitting members on the drive circuit layer 221 on the drive circuit layer 224, referring to FIG. 5;

step S5, peeling off the support base 222 from the substrate layer 221, referring to FIG. 6.

What is described above are only several implementations of the present application, and these embodiments are specific and detailed, but not intended to limit the scope of the present application. It should be understood by the skilled in the art that various modifications and improvements can be made without departing from the conception of the present application, and all fall within the protection scope of the present application. Therefore, the patent protection scope of the present application is defined by the appended claims.

What is claimed is:

1. A display substrate, comprising:
   a substrate layer comprising a first substrate portion and a second substrate portion joined to the first substrate portion;
   wherein the first substrate portion is made of a first substrate material and configured to be disposed opposite to a photosensitive element, the second substrate portion is made of a second substrate material being different from the first substrate material, a light transmittance of the first substrate material is larger than or equal to a light transmittance threshold, and a light transmittance of the second substrate material is smaller than the light transmittance threshold;
   wherein the first substrate material is a transparent polyimide, and the second substrate material is a yellow polyimide.

2. The display substrate of claim 1, wherein the substrate layer is made of a flexible material, the display substrate further comprises a support base and a sacrificial layer, the sacrificial layer is made of a homogeneous material and disposed on the support base, and the substrate layer is disposed on the sacrificial layer.

3. The display substrate of claim 2, wherein a thickness of the sacrificial layer is smaller than or equal to a thickness threshold.

4. The display substrate of claim 3, wherein the thickness threshold is 50 nm.

5. The display substrate of claim 2, wherein a material of the sacrificial layer is amorphous silicon, indium tin oxide, or a silicon-based organic material.

6. The display substrate of claim 1, wherein the first substrate portion has the same thickness as the second substrate portion.

7. The display substrate of claim 1, further comprising a drive circuit layer, wherein the drive circuit layer comprises a first circuit portion and a second circuit portion, the first circuit portion is located at a side of the first substrate portion away from the photosensitive element, the second circuit portion is located at a side of the second substrate portion away from the photosensitive element, and a light transmittance of the first circuit portion is larger than a light transmittance of the second circuit portion.

8. The display substrate of claim 7, wherein the first circuit portion comprises at least one first wiring layer made of a transparent conductive material.

9. The display substrate of claim 8, wherein the transparent conductive material comprises indium zinc oxide or indium tin oxide.

10. The display substrate of claim 7, wherein the second circuit portion comprises at least one second wiring layer, and each of the at least one second wiring layer comprises metal.

11. The display substrate of claim 7, wherein a circuit distribution density of the first circuit portion is smaller than a circuit distribution density of the second circuit portion.

12. The display substrate of claim 7, wherein the first circuit portion comprises a passive drive circuit, and the second circuit portion comprises an active drive circuit.

13. A display panel, comprising:
a substrate layer comprising a first substrate portion and a second substrate portion joined to the first substrate portion, the first substrate portion comprising a first substrate material and being configured to be positioned opposite to a photosensitive element, the second substrate portion comprising a second substrate material being different from the first substrate material, a light transmittance of the first substrate material being greater than or equal to a light transmittance threshold, and a light transmittance of the second substrate material being smaller than the light transmittance threshold; and light-emitting members disposed at a side of the substrate layer away from the photosensitive element, the light-emitting members comprising a first pixel region and a second pixel region, the first pixel region being disposed at a side of the first substrate portion away from the photosensitive element, and the second pixel region being disposed at a side of the second substrate portion away from the photosensitive element;

wherein the first substrate material is a transparent polyimide, and the second substrate material is a yellow polyimide.

14. The display panel of claim 13, wherein the substrate layer is made of a flexible material, the display substrate further comprises a support base and a sacrificial layer, the sacrificial layer is made of a homogeneous material and disposed on the support base, and the substrate layer is disposed on the sacrificial layer.

15. The display panel of claim 14, wherein a thickness of the sacrificial layer is smaller than or equal to a thickness threshold.

16. The display panel of claim 15, wherein the thickness threshold is 50 nm.

17. The display panel of claim 13, wherein the display substrate further comprises a drive circuit layer comprising a first circuit portion and a second circuit portion, the first circuit portion is located at the side of the first substrate portion away from the photosensitive element, the second circuit portion is located at the side of the second substrate portion away from the photosensitive element, and a light transmittance of the first circuit portion is greater than a light transmittance of the second circuit portion.

18. A display device, comprising the display panel of claim 13 and a photosensitive element, wherein the photosensitive element is opposite to the first substrate portion and is disposed at a side of the first substrate portion away from the first pixel region of the light-emitting members.

* * * * *